United States Patent
Chen et al.

(10) Patent No.: US 10,262,989 B2
(45) Date of Patent: *Apr. 16, 2019

(54) ESD PROTECTION FOR 2.5D/3D INTEGRATED CIRCUIT SYSTEMS

(71) Applicant: TAIWAN SEMICONDUCTOR MANUFACTURING CO., LTD., Hsin-Chu (TW)

(72) Inventors: Chia-Hui Chen, Hsinchu (TW); Fang-Tsun Chu, Taichung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 450 days.

This patent is subject to a terminal disclaimer.

(21) Appl. No.: 14/961,940

(22) Filed: Dec. 8, 2015

(65) Prior Publication Data

US 2016/0093606 A1    Mar. 31, 2016

Related U.S. Application Data

(63) Continuation of application No. 13/227,502, filed on Sep. 8, 2011, now Pat. No. 9,245,852.

(51) Int. Cl.
| | | |
|---|---|---|
| H01L 27/02 | (2006.01) | |
| H01L 23/552 | (2006.01) | |
| H01L 25/065 | (2006.01) | |
| H01L 23/498 | (2006.01) | |
| H01L 23/60 | (2006.01) | |
| H01L 23/62 | (2006.01) | |

(52) U.S. Cl.
CPC .... *H01L 27/0292* (2013.01); *H01L 23/49811* (2013.01); *H01L 23/49827* (2013.01); *H01L 23/552* (2013.01); *H01L 23/60* (2013.01); *H01L 23/62* (2013.01); *H01L 25/0652* (2013.01); *H01L 25/0655* (2013.01); *H01L 2224/16225* (2013.01); *H01L 2224/16238* (2013.01); *H01L 2224/81193* (2013.01); *H01L 2924/157* (2013.01); *H01L 2924/15192* (2013.01); *H01L 2924/15311* (2013.01)

(58) Field of Classification Search
USPC .................................. 361/760, 761
See application file for complete search history.

(56) References Cited

U.S. PATENT DOCUMENTS

| | | | |
|---|---|---|---|
| 5,644,167 A | 7/1997 | Weiler et al. | |
| 2005/0006706 A1* | 1/2005 | Stefanov | H01L 27/0262 257/368 |

(Continued)

FOREIGN PATENT DOCUMENTS

CN    101118327 A    2/2008

*Primary Examiner* — Andargie M Aychillhum
(74) *Attorney, Agent, or Firm* — Duane Morris LLP

(57) ABSTRACT

An integrated circuit structure includes first and second integrated circuit devices disposed on a interposer. Each integrated circuit device has electrostatic discharge (ESD) protection circuitry therein connected to an internal ESD bus. The first and second integrated circuit devices communicate with one another through the interposer. The interposer includes an ESD bus electrically connected to the ESD busses of the first and second integrated circuit devices for providing cross-device ESD protection for the integrated circuit devices.

20 Claims, 8 Drawing Sheets

(56) References Cited

U.S. PATENT DOCUMENTS

2008/0024714 A1* 1/2008 Park ................... G02F 1/13452
                                                                        349/150
2009/0079071 A1* 3/2009 Webb ................ H01L 23/49822
                                                                        257/738

\* cited by examiner

ESD PROTECTION FOR 2.5D/3D INTEGRATED CIRCUIT SYSTEMS

CROSS-REFERENCE TO RELATED APPLICATIONS

The present application is a continuation of and claims priority to U.S. patent application Ser. No. 13/227,502 filed Sep. 8, 2011, the entirety of which is hereby incorporated by reference herein.

TECHNICAL FIELD

The present invention relates to ESD protection schemes for integrated circuit structures, and more specifically to ESD protection schemes for 2.5D/3D integrated circuit structures.

BACKGROUND OF THE INVENTION

Integrated circuits ("ICs") are incorporated into many electronic devices. IC packaging has evolved, such that multiple ICs may be vertically stacked in so-called three-dimensional ("3D") packages in order to save horizontal area on a printed circuit board ("PCB"). An alternative packaging technique, referred to as a 2.5D package may use an interposer, which may be formed from a semiconductor material such as silicon, for coupling one or more dies to a PCB. An interposer is an intermediate layer often used for interconnection routing or as a ground/power plane for different IC chips. A plurality of IC chips, which may be of homogenous or heterogeneous technologies, are mounted on the interposer. Connections among the various ICs are routed through conductive patterns in the interposer. ESD protection in current 2.5D/3D IC applications is limited to intra-chip ESD protection without any chip-to-chip ESD discharge path.

BRIEF DESCRIPTION OF THE DRAWINGS

The accompanying drawings illustrate preferred embodiments of the invention, as well as other information pertinent to the disclosure, in which.

DETAILED DESCRIPTION

Figure 1:
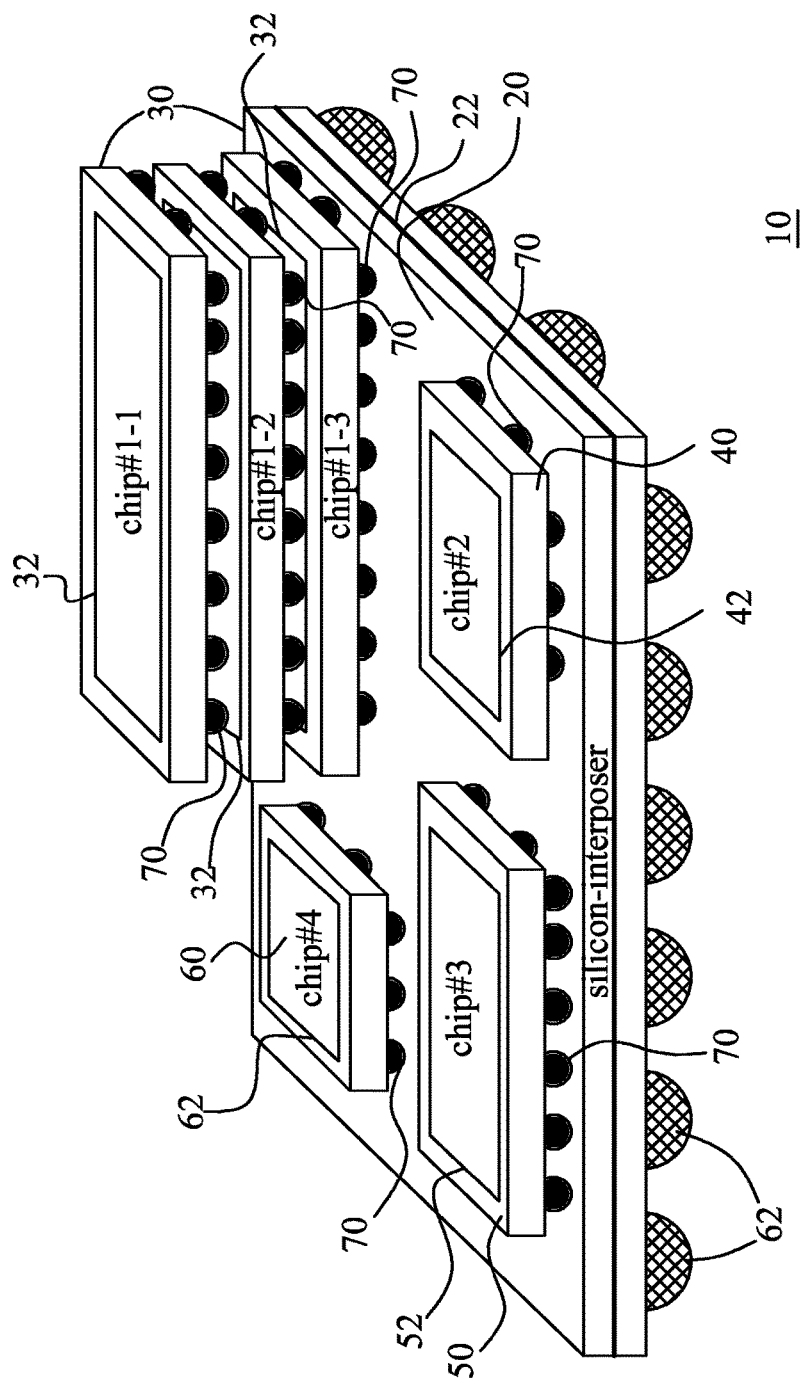
FIG. 1 is a schematic illustration of an embodiment of a 2.5D/3D integrated circuit package.

This description of the exemplary embodiments is intended to be read in connection with the accompanying drawings, which are to be considered part of the entire written description. In the description, relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. Likewise, terms concerning electrical coupling and the like, such as "coupled", "connected" and "interconnected," refer to a relationship wherein structures communicate with one another either directly or indirectly through intervening structures unless expressly described otherwise.

An improved 2.5D/3D integrated circuit (IC) design is disclosed herein that provides a global ESD bus for providing cross-chip ESD protection. Providing an ESD bus that is continuous throughout the entire I/O domain of the 2.5D/3D IC provides robust ESD protection in this evolving technology. In embodiments, the global ESD bus in incorporated into the interposer, which is connected to the ESD bus of each chip, to achieve robust "cross chip" ESD protection.

FIG. 1 is a highly schematic illustration of an example of a 2.5D/3D integrated circuit package 10. The package is referred to herein as a "2.5D/3D" design because the general ESD protection architecture applies to both 2.5D and 3D designs. As shown in FIG. 1, the 2.5D/3D IC package 10 includes a three-chip stack of chips 30 disposed on the interposer 20. The chips of this chip stack 30 are labeled "chip #1-1", "chip #1-2" and chip #1-3". Each chip from the chip stack 30 is provided with its own ESD bus 32 for conducting ESD current. Second, third and fourth chips 40, 50 and 60, respectively, are also disposed on the interposer 20 and provided with their own respective ESD busses 42, 52 and 62. Of particular note, the interposer is provided with its own global ESD bus 22, which as described in more detail below is coupled to the ESD busses of the chips 30, 40, 50, 60. The chips 30, 40, 50, 60 are interconnected to one another and to the interposer 20 through small conductive bumps 70, which may be referred to as a "microbumps" or "μ-bumps". Conductive bumps or balls 80 are disposed on the underside of the interposer 20 for coupling the IC package 10 to a printed circuit board ("PCB") (not shown) on which it is mounted. Typically, the PCB would have larger conductive "balls" formed at its bottom side. Microbumps 70 connecting the IC chips to interposer 20 may have different sizes and electrical properties than the bumps 80 connecting the interposer 20 to the PCB.

It should be appreciated that the chips disposed on the interposer can be of homogenous or heterogeneous design and can be, by way of example only, logic chips, memory chips, memory stacks, field-programmable gate array (FPGA), integrated passive devices (IPD), or microprocessors.

As will be familiar to those of ordinary skill in this art, the interposer 20 includes a semiconductor substrate (e.g., silicon substrate) having front-side and back-side interconnect layers formed on its front and back major surfaces, respectively. In some applications, the substrate is not grounded and thus is electrically floating. Front- and back-side interconnect layers each may comprise a plurality of inter-metal dielectric (IMD) layers, which include via level layers (V1, V2, etc.) and metal line level layers (e.g., M1, M2, etc.). Of course, the interposer can also include and utilize other connection layers, such as PO, OD, or RDL layers. A conductor in the front-side interconnect layer may be electrically connected to metal conductors in the back-side interconnect layer by way of a through-silicon vias ("TSV") that extends from the front-side surface of the semiconductor substrate to the rear-side surface of the semiconductor substrate. With this general understanding of the structure of the interposer layer, an embodiment of the ESD protection scheme for a 2.5D/3D IC system is illustrated in connection with FIGS. 2-7.

Figure 2:
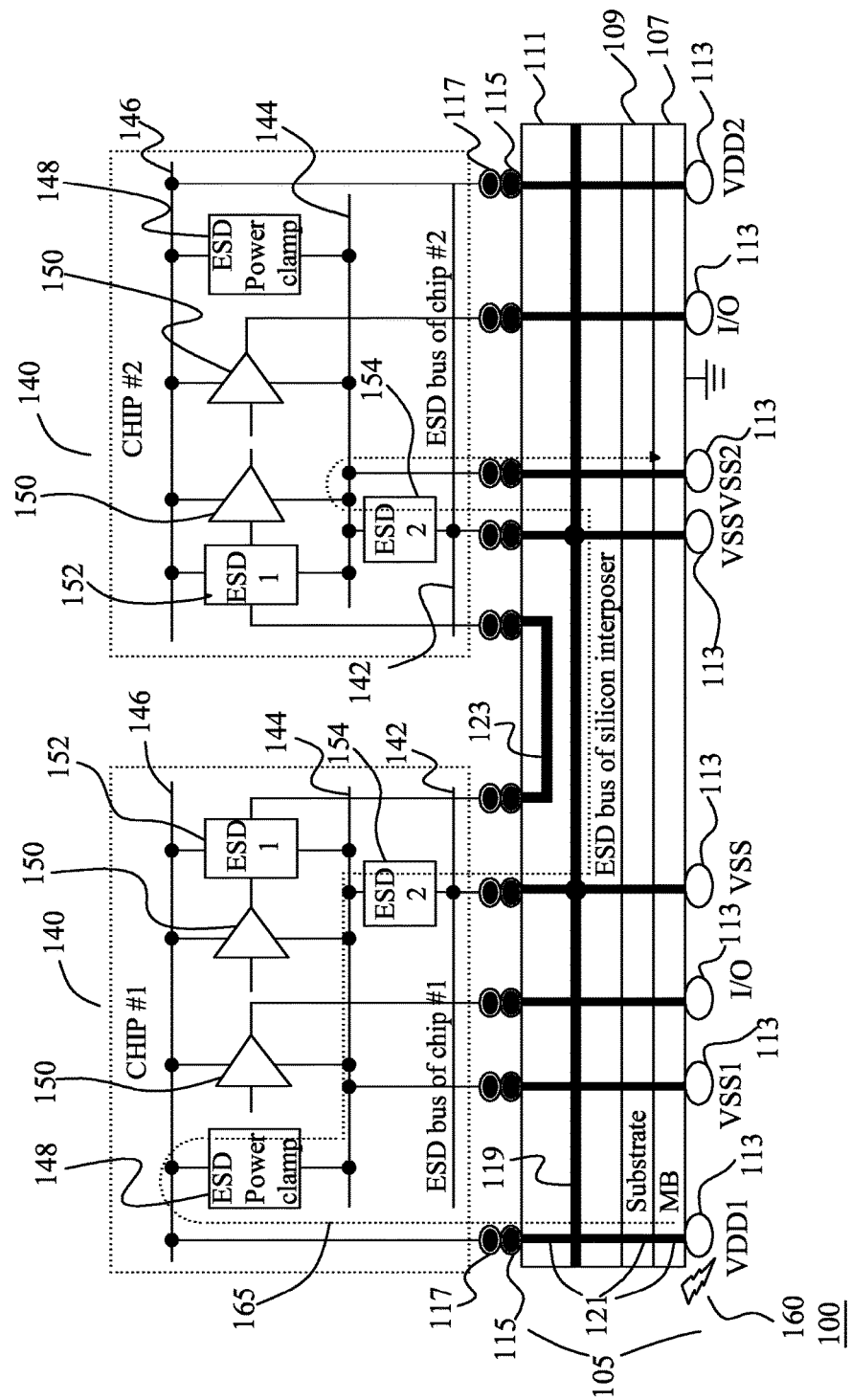
FIG. 2 illustrates an embodiment of an ESD protection scheme for a 2.5D/3D integrated circuit package.

FIG. 2 illustrates an implementation of a 2.5D/3D IC package 100 having a global ESD bus within a passive interposer layer that is connected to the ESD global bus of each chip to provide a complete cross-chip ESD protection network. Although the 2.5D/3D IC package 100 is shown as having only two chips (labeled Chip #1 and Chip #2), it should be understood that the design is equally applicable to packages having more than two chips, such as is illustrated in FIG. 1.

In terms of its ESD protection, each of chips 140 has a conventional internal ESD protection scheme. Each chip has I/O buffers 150 that are coupled between high and lower power supply rails 146, 144 and to I/O input (labeled "I/O" at the bottom of FIG. 2). Each chip 140 also includes an ESD power clamp 148 and a first ESD protection module 152 (labeled "ESD1") for I/O ESD protection coupled between the power supply rails 144, 146, and a second ESD module 154 for noise ESD protection coupled between the low power supply rail 142 and the chip's ESD bus 142. It should be understood that each chip 140 can include multiple ESD modules 152 and modules 154 as required by the design. The low power supply rail of each chip is connected to a respective ground bump connector 113 (VSS1 or VSS2) having a respective ground assignment. The ESD bus 119 of the interposer 105 (discussed below) is coupled to a ground connector (VSS) having a ground assignment different than the ground connectors VSS1, VSS2 connected to the integrated circuit devices. Grounds VSS1, VSS2 and VSS may be connected to the same ground assignment through the PCB but for noise isolation the grounds VSS1, VSS2, VSS are disconnected at the IC chip level. Of course, for IC systems in which noise isolation is not a concern, the VSS1, VSS2 and VSS may be connected to the same ground assignment of the integrated circuit device, and in this case, ESD2 protection can be omitted.

Figure 8A:
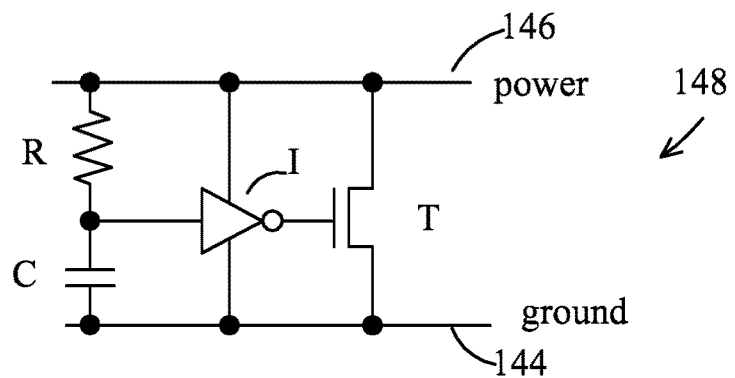
FIGS. 8A-8C illustrate embodiments of ESD protection circuits for use in the 2.5D/3D integrated circuit package of FIG. 1.
Figure 8B:
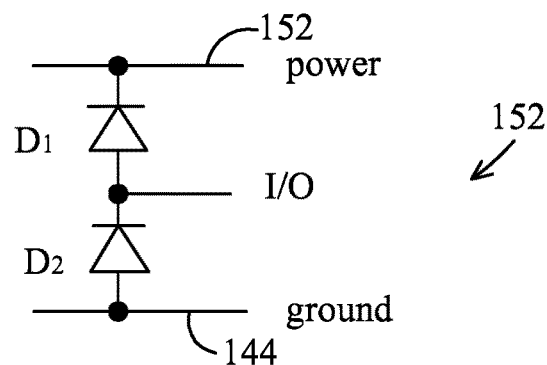
Figure 8C:
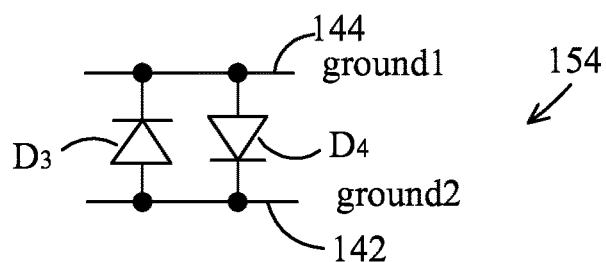

Conventional embodiments of the ESD power clamp 148 and first and second ESD modules 152, 154 are illustrated in FIGS. 8A-8C. Specifically, FIG. 8A illustrates a ESD power clamp circuit 148 comprising an RC circuit (formed from resistor R and capacitor C), inverter I and transistor T. The ESD module 152 is illustrated in FIG. 8B and includes a pair of stacked diodes $D_1$ and $D_2$ coupled between the power and ground lines 146, 144, with an I/O node coupled therebetween. This ESD module 152 is configured to provide an input/output (I/O) signal ESD protection circuit. Finally, the ESD module 153 is illustrated in FIG. 8C and includes a pair of cross-coupled (back-to-back) diodes D3 and D4 coupled between low power supply rail 144 and the chip's ESD bus 142. This module provides a noise isolation ESD protection circuit and completion of the ESD protection network via the interposer's ESD bus.

Returning to FIG. 2, the multi-layer interposer is identified by reference 105. The interposer 105 includes, from bottom to top, a back-side metal interconnect layer 107, substrate layer 109 and top- or font-side metal interconnect layer 111. Conductive bumps 113 are provided at the bottom-side interconnect layer 107 and labeled VDD1 and VDD2 (for the chip #1 and #2 high power supplies, respectively), VSS1 and VSS2 (for the chip #1 and #2 low power supplies (i.e., ground), respectively), I/O (for chip I/O), and VSS (for the common chip #1 and #2 and interposer ESD ground). The interposer 105 has microbumps 115 for connecting to matching microbumps 117 of the chips 140. Each set of microbumps 115, 117 connects through conductive vias 121, and optionally one or more lateral metal interconnects, formed through the interposer 105 to the corresponding conductive bump 113. In one embodiment, the ESD bus 119 is formed within the top-side metal interconnect layer 111 and is connected by its own conductive vias 121 to the VSS conductive bump. Of course, the ESD bus 119 may also be formed in whole or in part from other interconnect layers within the interposer, including, for example only, the backside metal layer, RPL, OD or PO layers. The I/O of the chips 140 are connected together through one or more conductive lines 123 in the top-side metal interconnect 111 to allow inter-chip communications. This conductive line 123 represents one location for possible circuit damage in conventional designs that do not have global ESD protection scheme described herein.

The ESD bus 119 of the interposer 105 is used for dissipating cross-chip ESD events between any two different pins of the chips. For example, the dashed-line path 165 shown in FIG. 2 illustrates the discharge path for an ESD event 160 on the VDD1 terminal of Chip #1. The discharge path 165 progresses as follows: from the VDD1 terminal/bump through the corresponding conductive vias 121 of the interposer 105; to chip #1 high power supply rail 146; through chip #1 ESD power clamp 148; through chip #1 low power supply rail 144; through chip #1 ESD2 module 154; into and through the ESD bus 119 of the interposer 105; through chip #2 ESD2 module 154; to chip #2 low power supply rail 144; and down to chip #2 VSS2 terminal by way of the corresponding conductive vias within the interposer 105. Without the connecting ESD bus 119 within the interposer 105, the only path to discharge the cross-chip ESD current would be through the interface signal between the two chips (e.g., from rail 146, to I/O 150, ESD module 152 and through interface line 123 to the second chip), increasing the chances of ESD failure at the interface circuits.

Figure 3:
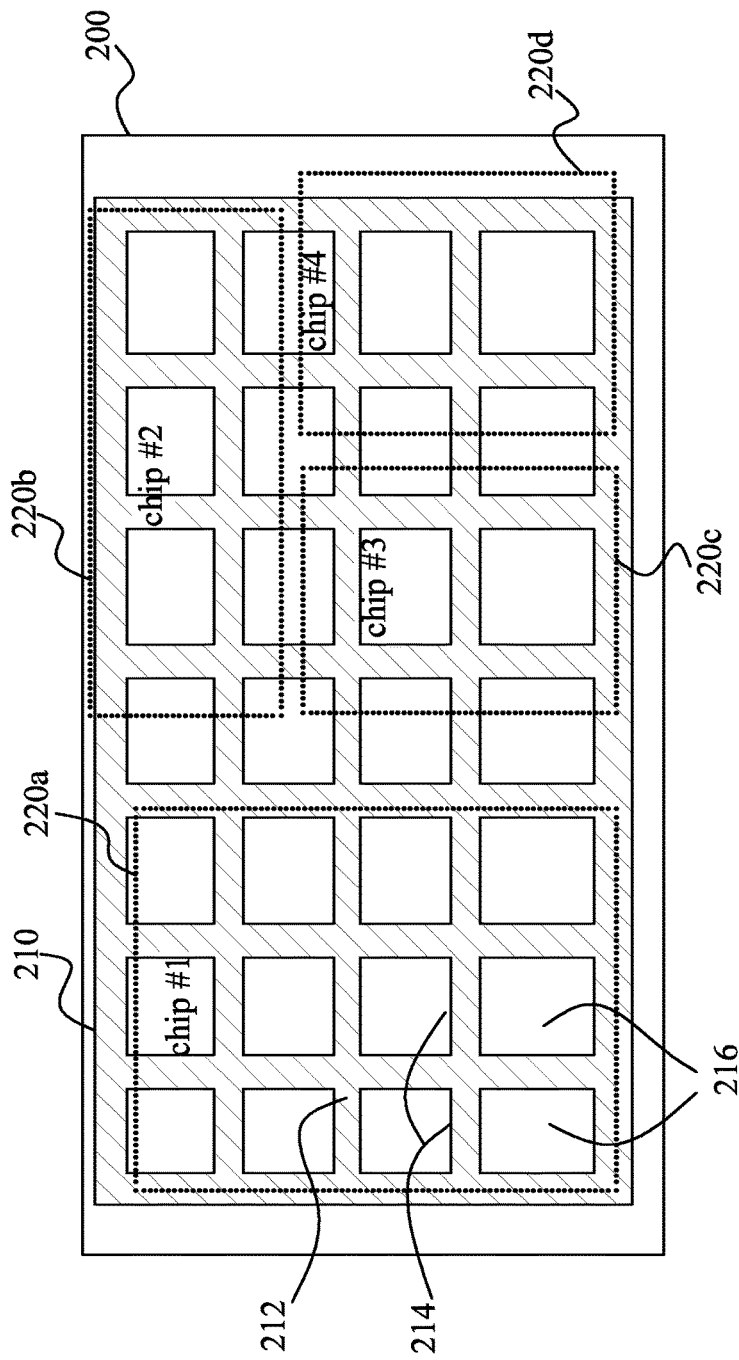
FIG. 3 illustrates an embodiment of an ESD bus within an interposer of the 2.5D/3D integrated circuit package of FIG. 2.

FIG. 3 illustrates a topside schematic illustration of an embodiment of an interposer layer 200. Specifically, FIG. 3 illustrates an embodiment of a layout for the ESD bus within the interposer layer (e.g., for ESD bus 22 in FIG. 1 or ESD bus 119 in FIG. 2). In this embodiment, the ESD bus 210 is arranged in a conductive mesh layout, preferably a metal mesh layout. As discussed above in connection with FIGS. 1 and 2, chips, such as chips 220a, 220b, 220c and 220d (illustrated via dashed line profile), are disposed over the interposer layer 200 and ESD bus 210. Connections from the chips 220 to the conductive mesh 210, e.g., to a mesh cross point 212 or even mesh leg 214, are made from the overlying chip 220 through a conductive via 121 in the interconnect layer 111 (see FIG. 2). Likewise, connections from the mesh 210 to the conductive bumps 113 (specifically VSS bumps 113) are made through conductive vias 121 formed through interconnect layer 111, substrate 109 and bottom metal interconnect layer 107 (again, see FIG. 2). The mesh layout provides two benefits. First, the mesh layout provides multiple convenient locations to make connections both to the overlying chip and to the underlying conductive bumps 113.

The design is thus very flexible while also leaving significant open areas 216 within the mesh through which other connections to the chips 220 (e.g., VDD, VSS and I/O) can be made. Second, the mesh bus 210 allows for the design of low resistance paths for ESD discharge since it facilitates selected connections that provide short paths for the ESD current to pass. This ability improves ESD performance.

Figure 4:
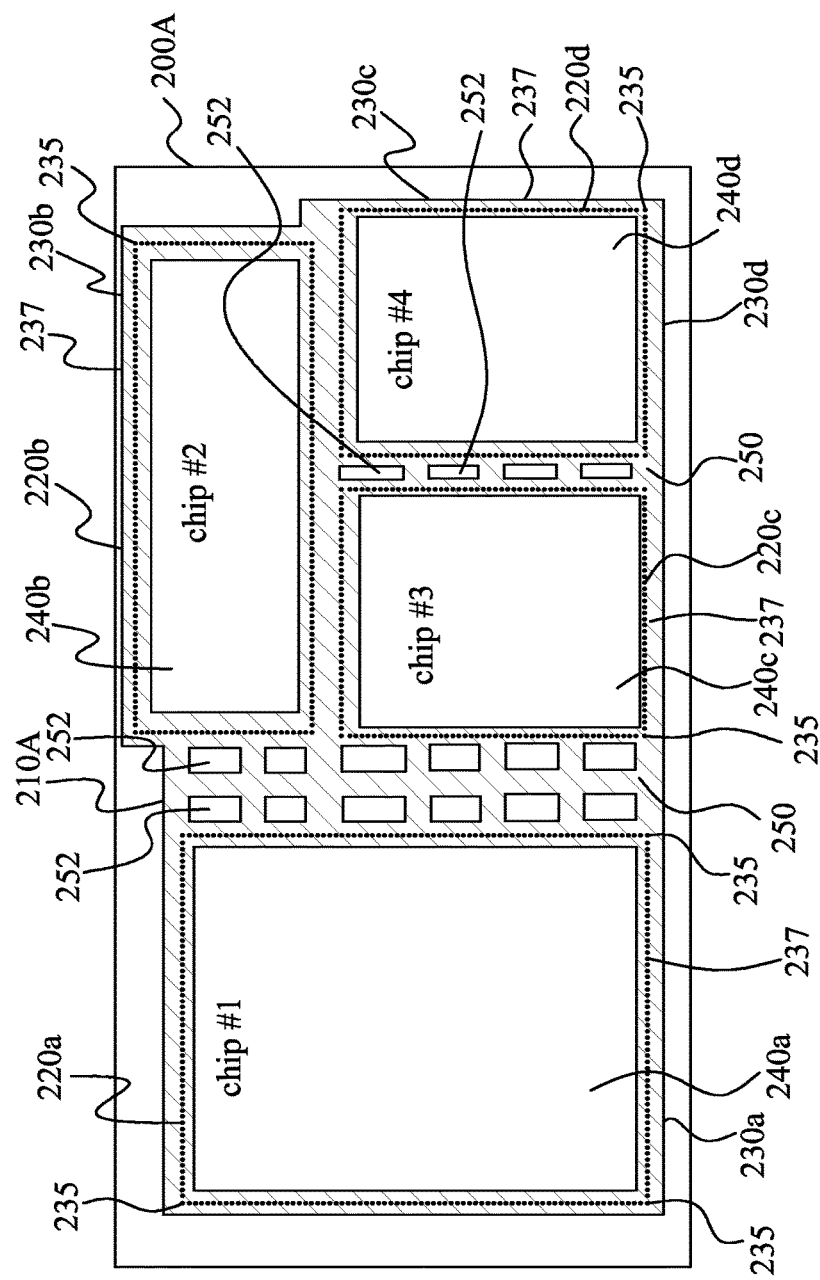
FIG. 4 illustrates another embodiment of the ESD bus within the interposer of the 2.5D/3D integrated circuit package of FIG. 2.

FIG. 4 illustrates a topside schematic illustration of an alternative embodiment of an interposer layer 200A. Specifically, FIG. 4 illustrates an embodiment of a layout for the ESD bus within the interposer layer (e.g., for ESD bus 22 in FIG. 1 or ESD bus 119 in FIG. 2). In this embodiment, the ESD bus 210A is arranged in a plurality of connected rings 230a, 230b, 230c, 230d each associated with a respective overlying chip 220a, 220b, 220c, 220d. The rings define larger (when compared to the design of FIG. 3) open areas 240a, 240b, 240c, 240d, respectively, that are connected by metal connectors 250. Metal connectors 250 may be configured as meshes to provide open areas 252 through which conductive vias can extend. This embodiment may be utilized when resources in the interposer layer 200A are limited or at a premium since the ESD bus 210A consumes less metal area (i.e., has a smaller footprint) in the interposer layer and leaves more open area through which other connections (both vertical and horizontal) can pass. In this embodiment, chip-to-ESD bus connections are preferably made at corners of the rings 230, some of which have been labeled as corners 235. ESD bus-to-conductive bump 113 connections may also be made to corners 235 or to ring connection areas 250.

Figure 5:
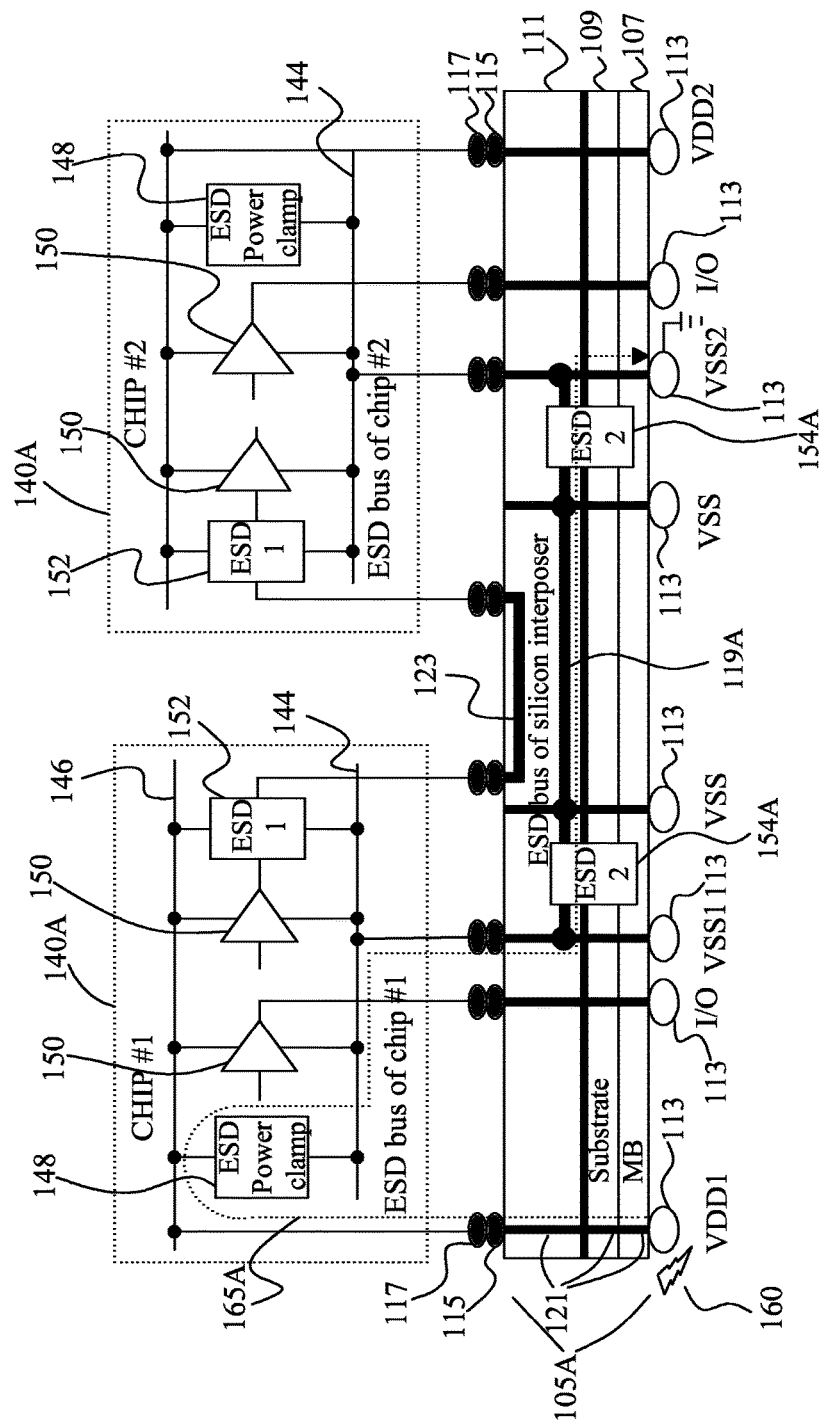
FIG. 5 illustrates an embodiment of an ESD protection scheme for a 2.5D/3D integrated circuit package.

FIG. 5 illustrates another embodiment of a 2.5D/3D IC package 100A. The IC package 100A is identical to that of IC package 100 shown in FIG. 2 and described above, and as such like reference numbers are used to identify like components, except that the interposer layer 105 is active rather than passive. As can be seen from FIG. 5, the IC package 100A includes a modified interposer layer 105A for use in connection with modified chips 140A. The chips 140A do not include a noise protection ESD2 module 154 or ESD bus 142 (see FIG. 2). Rather, the modified interposer layer 105A has built in ESD2 modules 154A. coupled to the ESD bus 119A. Low power supply rails 144 of the chips 140A are labeled as the ESD bus of the chips 140A.

The dashed-line path 165A shown in FIG. 2A illustrates the discharge path for an ESD event 160 on the VDD1 terminal assigned to Chip #1. The discharge path progresses as follows: from the VDD1 terminal through the corresponding conductive vias 121 of the interposer 105A; to chip #1 high power supply rail 146; through chip #1 ESD power clamp 148; through chip #1 low power supply rail 144, which serves as the first chip ESD bus; into a first ESD2 module 154A within interposer 105A; through the ESD bus 119A of the interposer 105A; through a second ESD2 module 154A, which is coupled to chip #2; and down to chip #2 VSS2 terminal by way of the corresponding conductive vias within the interposer 105. Without the connecting bus 119A within the interposer 105, the interface circuitry between the two chips would be exposed to and at risk from the cross-chip ESD event.

Although FIG. 5 shows the noise isolation ESD2 circuit being formed in the active interposer layer 105A, it should be appreciated that other ESD protection components of the system could be formed in the active interposer layer, including, for example, the ESD power clamp and/or I/O signal ESD protection circuit to enhance the performance of the IC system.

Figure 6:
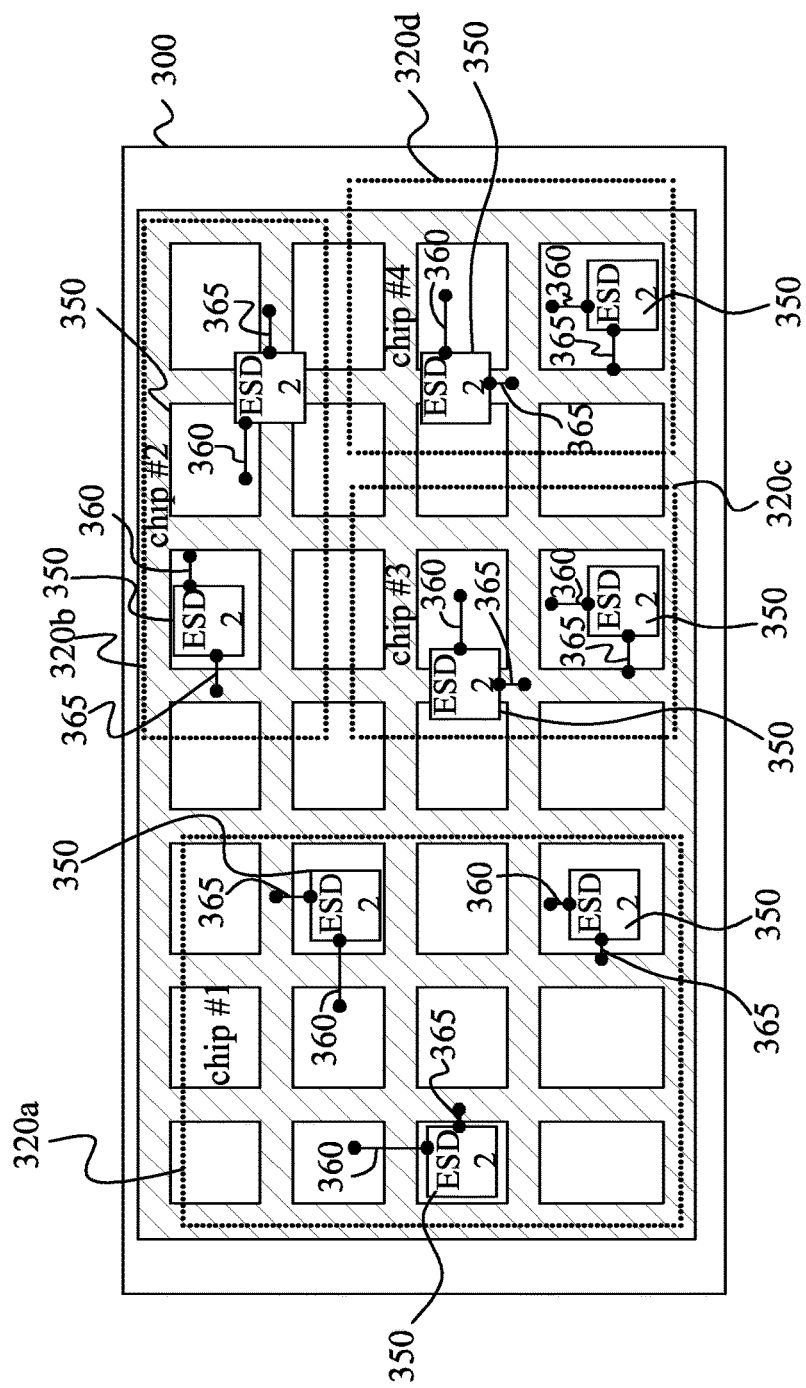
FIG. 6 illustrates an embodiment of an ESD bus within a interposer of the 2.5D/3D integrated circuit package of FIG. 5.

FIG. 6 illustrates a topside schematic illustration of an embodiment of an interposer layer 300. Specifically, like FIG. 3, FIG. 6 illustrates an embodiment of a layout for the ESD bus within the interposer layer (e.g., for ESD bus 22 of FIG. 1 or for ESD bus 119A in FIG. 5). In this embodiment, the ESD bus 310 is arranged in a conductive mesh layout, preferably a metal mesh layout. Chips 320a, 320b, 320c and 320d (illustrated via dashed line profile) are disposed on the interposer layer 300 and over ESD bus 119A. ESD2 modules 350 are formed in the substrate layer 109 of interposer 105A (See FIG. 5) and connected at one end via conductive vias and/or interconnects 365 within interconnect layer 111 to the ESD bus 310 and at the other end through conductive interconnects and vias 360 up to the ESD bus of a respective chip 320. The vertical aspects of these connections can occur within mesh openings 316. In this embodiment, the chips 320 do not need to connect directly to the ESD bus 310 but rather connect through active devices, i.e., through the ESD2 modules 350. As with the embodiment of FIG. 3, connections from the mesh 310 to the conductive bumps 113 (specifically VSS bumps 113) are made through conductive vias 121 formed through interconnect layer 111, substrate 109 and bottom metal interconnect layer 107 (again, see FIG. 2).

It should be understood that the global ESD bus in the interposer layer does not have to be formed in a single conductive layer. Rather, the ESD bus could be formed using different conductive layers to form the mesh connection. In embodiments, even the back-side metal could be used for forming a portion of the global ESD bus.

As discussed above in connection with FIG. 3, the mesh ESD bus layout provides multiple convenient locations to make connections and thus is very flexible in design while also leaving significant open areas 316 within the mesh through which other connections to the chips 320 can be made. The interposer layer 105A can include more than one ESD2 module 350 for each chip 320. The mesh bus 310 presents low resistance to ESD discharge since it allows for reductions in the length of the ESD path through which the ESD event passes. This ability improves ESD performance.

Figure 7:
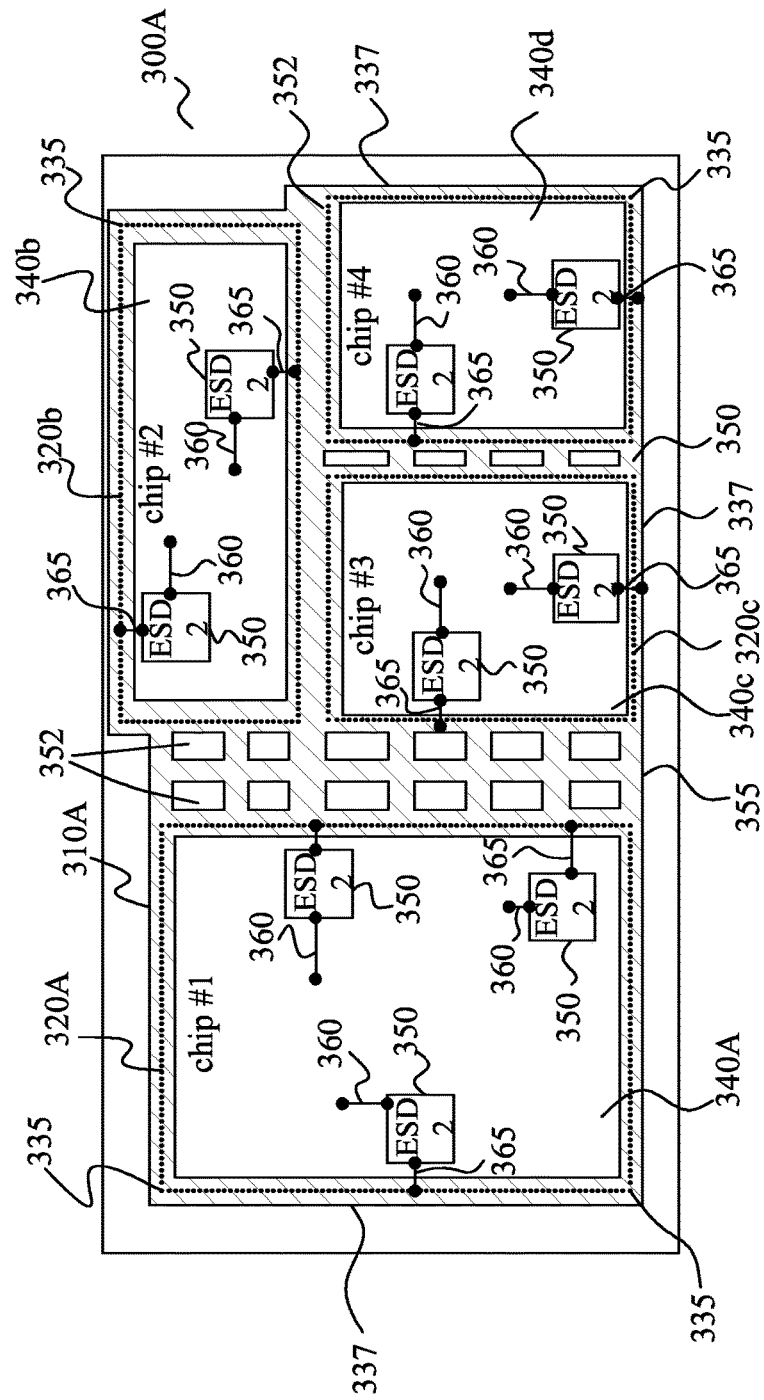
FIG. 7 illustrates another embodiment of the ESD bus within the interposer of the 2.5D/3D integrated circuit package of FIG. 5.

FIG. 7 illustrates a topside schematic illustration of an alternative embodiment of an interposer layer 300A. Specifically, like FIG. 4, FIG. 7 illustrates an embodiment of a layout for the ESD bus within the interposer layer (e.g., for ESD bus 119A in FIG. 5). In this embodiment, the ESD bus 310A is arranged in a plurality of connected rings 330a, 330b, 330c, 330d each associated with a respective overlying chip 320a, 320b, 320c, 330d. The rings define large open areas 340a, 340b, 340c, 340d, respectively, that are connected by metal connectors 350, which may be configured as meshes to provide open areas 352 through which conductive via connections can extend. This embodiment may be utilized when resources in the interposer layer are limited since the ESD bus 310A consumes less metal area (i.e., has a smaller footprint) in the interposer layer and provides more open area for other connections (both vertical and horizontal). As with the embodiment of FIG. 6, chip-to-ESD module connections are made through vertical and horizontal interconnects 360, and ESD module-to-ESD bus connections are made through vertical and horizontal interconnects 365. Connections from ESD bus 310A to conductive bumps 113 can be made from corners 335 or sides 337 of ring connection areas 350.

Although FIGS. 2, 3, 6 and 7 show the ESD busses 119, 119A as having either mesh or ring shaped configurations, it should be understood that other shapes and configurations may be used as dictated by design needs. Generally, ESD performance is enhanced by minimizing the length of the ESD path through the ESD bus. With this principle as guidance, the ESD bus layout can designed based on the location of the corresponding conductive bumps 70 of the chips and bumps 80 of the interposer, and the layout of metal interconnects within interconnection layers 107, 111 of the interposer. It should also be understood from the foregoing disclosure that the ESD path within the interposer may include only passive components (e.g., conductive lines and/or resistors) or may include active components (e.g., diodes).

It should be appreciated that although various embodiments have been described herein in connection with 2.5D package designs or hybrid 2.5D/3D designs, wherein both individual chips and chip stacks are disposed on the interposer, it should be understood that the ESD protection scheme described herein is applicable to pure 3D designs with a chip stack is disposed on a interposer and the interposer is used in part for communications between the chips in the stack. Moreover, the ESD protection scheme can be employed even in designs where the chips do not share I/O since ESD events can happen between power/ground pins of different chips. The interposer provides for cross-chip ESD protection, providing robust and comprehensive ESD protection.

In one embodiment of a 2.5D/3D integrated circuit structure disclosed herein, the integrated circuit structure includes first and second integrated circuit devices disposed on an interposer. Each integrated circuit device has electrostatic discharge (ESD) protection circuitry therein connected to an internal ESD bus. The interposer includes an ESD bus electrically connected to the ESD busses of the first and second integrated circuit devices for providing cross-device ESD protection for the integrated circuit devices.

In other embodiments of a 2.5D/3D integrated circuit structure, the structure includes an interposer having metal interconnect layers and a substrate layer therebetween, and first and second integrated circuit chips disposed on the interposer. Each integrated circuit device has on-chip electrostatic discharge (ESD) protection circuitry. The on-chip ESD protection circuitry of each integrated circuit chip includes an ESD power clamp for power to ground protection and an input/output (I/O) signal ESD protection circuit. The 2.5D or 3D integrated circuit structure also includes first and second noise isolation ESD protection circuits associated with the first and second integrated circuit chips, respectively, for noise isolation between different grounds. The interposer includes an ESD bus electrically connected to the first and second noise isolation ESD protection circuits for providing cross-device ESD protection for the integrated circuit chips.

In another embodiment, the integrated circuit structure includes first and second integrated circuit devices disposed on an active interposer, the active interposer including an ESD bus electrically connected to the first and second integrated circuit devices for passing cross-chip ESD current. The active interposer includes ESD protection circuitry for each integrated circuit device formed therein electrically connected to the ESD bus of the active interposer.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. An integrated circuit structure, comprising:
first and second integrated circuit devices disposed on an interposer, each integrated circuit device having electrostatic discharge (ESD) protection circuitry therein connected to an internal ESD bus,
the interposer including an I/O connection line connecting I/O of the first and second integrated circuit devices, and an ESD bus electrically connected to the ESD busses of the first and second integrated circuit devices for providing cross-device ESD protection for the integrated circuit devices,
wherein ESD current from ESD occurring between the first and second integrated circuit devices flows through the ESD bus of the interposer bypassing the I/O connection line.

2. The integrated circuit structure of claim 1, wherein the first and second integrated circuit devices are connected through the interposer to respective ground connectors at a bottom side of the interposer, and the ESD bus of the interposer is electrically connected to a respective ground connector at the bottom side of the interposer.

3. The integrated circuit structure of claim 1, wherein the interposer comprises a metal interconnect layer, and the ESD bus of the interposer is formed within a metal line level layer within the metal interconnect layer.

4. The integrated circuit structure of claim 3, wherein the ESD bus of the interposer is arranged in a mesh configuration underlying the first and second integrated circuit devices.

5. The integrated circuit structure of claim of claim 3, wherein the ESD bus of the interposer comprises a first ring structure disposed underneath the first integrated circuit device and a second ring structure disposed underneath the second integrated circuit device and connected to the first ring structure in the interposer.

6. The integrated circuit structure of claim 4, wherein the ESD busses of the first and second integrated circuit devices are electrically connected to the ESD bus of the interposer directly without any intervening active devices.

7. The integrated circuit structure of claim 4, wherein the interposer comprises at least first and second ESD protection circuits electrically connected between the ESD busses of the first and second integrated circuit devices, respectively, and the ESD bus of the interposer.

8. The integrated circuit structure of claim 5, wherein the ESD busses of the first and second integrated circuit devices are electrically connected to the first and second ring structures, respectively, directly without any intervening active devices.

9. The integrated circuit structure of claim 5, wherein the interposer comprises at least first and second ESD protection circuits electrically connected between the ESD busses of the first and second integrated circuit devices and the first and second ring structures, respectively.

10. The integrated circuit structure of claim 1, comprising at least first and second ESD protection circuits, the first and second ESD protection circuits being electrically connected between a low power supply node of the first and second integrated circuit devices, respectively, and the ESD bus of the interposer.

11. The integrated circuit structure of claim 10, wherein the first and second ESD protection circuits are included within the first and second integrated circuit devices respectively and electrically connected between the low power supply node and ESD bus of each integrated circuit device.

12. The integrated circuit structure of claim 10, wherein the first and second ESD protection circuits are formed in the interposer.

13. A structure, comprising:
an interposer;
first and second integrated circuit chips disposed on the interposer, each integrated circuit chip having on-chip electrostatic discharge (ESD) protection circuitry; and
first and second noise isolation ESD protection circuits for noise isolation between different grounds associated with the first and second integrated circuit chips, respectively,
wherein the interposer includes an I/O connection line connecting I/O of the first and second integrated circuit chips and an ESD bus electrically connected to the first and second noise isolation ESD protection circuits, wherein the interposer provides for cross-device ESD protection for ESD occurring between a pin of the first integrated circuit chip and a pin of the second integrated circuit chip by allowing ESD current flowing between the pins to bypass the I/O connection line through the ESD bus of the interposer.

14. The integrated circuit structure of claim 13, wherein the first and second integrated circuit chips are connected through the interposer to first and second ground connectors, respectively, of the interposer, and the ESD bus of the interposer is electrically connected to an interposer ground connector of the interposer.

15. The integrated circuit structure of claim 14, wherein the first and second ground connectors are electrically connected to the on-chip electrostatic discharge (ESD) protection circuitry of the first and second integrated circuit chips, respectively.

16. The integrated circuit structure of claim 15, wherein the ESD bus comprises, within a topside metal interconnect layer, a first ring structure underneath the first integrated circuit chip and a second ring structure underneath the second integrated circuit chip and connected to the first ring structure.

17. The integrated circuit structure of claim 15, wherein the ESD bus of the interposer comprises a metal line mesh underlying the first and second integrated circuit chips formed within a metal interconnect layer.

18. The integrated circuit structure of claim 17, wherein the first and second noise isolation ESD protection circuits are formed in the interposer and electrically connected between the first and second ground connectors, respectively, and the ESD bus of the interposer.

19. The integrated circuit structure of claim 16, wherein the first and second noise isolation ESD protection circuits are formed in the interposer and electrically connected between the first and second ground connectors, respectively, and the ESD bus of the interposer.

20. A structure, comprising:
first and second integrated circuit devices disposed on an active interposer, the active interposer including an I/O connection line for connecting I/O of the first and second integrated circuit devices and an ESD bus electrically connected to the first and second integrated circuit devices for passing ESD current flowing between the first integrated circuit device and the second integrated circuit device, thereby bypassing the I/O connection line, the active interposer comprising ESD protection circuitry for each integrated circuit device formed therein electrically connected to the ESD bus of the active interposer.

* * * * *